United States Patent
Yagubizade et al.

(10) Patent No.: US 11,300,886 B2
(45) Date of Patent: Apr. 12, 2022

(54) METHOD OF ADAPTING FEED-FORWARD PARAMETERS

(71) Applicant: ASML NETHERLANDS B.V., Veldhoven (NL)

(72) Inventors: Hadi Yagubizade, Eindhoven (NL); Ahmet Koray Erdamar, Eindhoven (NL); Hakki Ergün Cekli, Singapore (SG)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/637,792

(22) PCT Filed: Jul. 12, 2018

(86) PCT No.: PCT/EP2018/068961
§ 371 (c)(1),
(2) Date: Feb. 10, 2020

(87) PCT Pub. No.: WO2019/034342
PCT Pub. Date: Feb. 21, 2019

(65) Prior Publication Data
US 2020/0166854 A1 May 28, 2020

(30) Foreign Application Priority Data
Aug. 14, 2017 (EP) ..................... 17186129

(51) Int. Cl.
*G03F 7/20* (2006.01)
(52) U.S. Cl.
CPC .......... *G03F 7/70516* (2013.01); *G03F 7/705* (2013.01); *G03F 7/70525* (2013.01);
(Continued)

(58) Field of Classification Search
CPC .. G03F 7/70483; G03F 7/70491; G03F 7/705; G03F 7/70508; G03F 7/70516;
(Continued)

(56) References Cited

U.S. PATENT DOCUMENTS

| | | | | |
|---|---|---|---|---|
| 2006/0008716 A1* | 1/2006 | Jeunink | ............... | G03F 7/70491 430/30 |
| 2006/0114437 A1* | 6/2006 | Akhssay | ............. | G03F 7/70891 355/55 |

(Continued)

FOREIGN PATENT DOCUMENTS

| | | |
|---|---|---|
| WO | 2016162231 | 10/2016 |
| WO | 2017050523 | 3/2017 |
| WO | 2017060080 | 4/2017 |

OTHER PUBLICATIONS

International Search Report and Written Opinion issued in corresponding PCT Patent Application No. PCT/EP2018/068961: dated Oct. 15, 2018.

(Continued)

*Primary Examiner* — Christina A Riddle
(74) *Attorney, Agent, or Firm* — Pillsbury Winthrop Shaw Pittman LLP

(57) ABSTRACT

A method for correcting values of one or more feed-forward parameters used in a process of patterning substrates, the method including: obtaining measured overlay and/or alignment error data of a patterned substrate; and calculating one or more correction values for the one or more feed-forward parameters in dependence on the measured overlay and/or alignment error data.

22 Claims, 5 Drawing Sheets

(52) U.S. Cl.
CPC ...... *G03F 7/70616* (2013.01); *G03F 7/70633* (2013.01); *G03F 7/70783* (2013.01); *G03F 7/70875* (2013.01)

(58) Field of Classification Search
CPC ............. G03F 7/70525; G03F 7/70533; G03F 7/70541; G03F 7/70591; G03F 7/706; G03F 7/70616; G03F 7/70633; G03F 7/70683; G03F 7/70783; G03F 7/70875; G03F 7/70858–70891
USPC ...... 355/18, 30, 52–55, 67–77; 700/95, 108, 700/117, 121
See application file for complete search history.

(56) References Cited

U.S. PATENT DOCUMENTS

| | | | | |
|---|---|---|---|---|
| 2006/0262287 | A1* | 11/2006 | Hiar | G03F 7/70875 355/30 |
| 2007/0082280 | A1* | 4/2007 | Menchtchikov | G03F 7/70783 430/30 |
| 2009/0323039 | A1* | 12/2009 | Wardenier | G03F 7/70875 355/67 |
| 2012/0008127 | A1 | 1/2012 | Tel et al. | |

OTHER PUBLICATIONS

Van Haren, Richard et al.: "Impact of reticle writing errors on the on-product overlay performance", Proc. of SPIE, vol. 9235. Oct. 15: 2014.

Research Disclosure No. 621013, "Improved Overlay Control via Feedforward of In-plane Deformation Measurements", Kenneth Mason Publications. vol. 621. No. 13, Jan. 1, 2016.

Chue, Chuei-Fu et al.: "Optimization of alignment/overlay sampling and marker layout to improve overlay performance for double patterning technology", Proc. of SPIE, vol. 7520; Dec. 11, 2009.

Halle, Scott et al.: "Lens Heating Challenges for Negative Tone Develop Layers with Freeform Illumination: A comparative study of experimental vs. simulated results", Proc. of SPIE, vol. 8326, Mar. 1, 2012.

Bumhwan, Joen et al.: "Evaluation of Lens Heating Effect in High Transmission NTD Processes at the 20nm Technology Node", Proc. of SPIE. vol. 9050, Apr. 2, 2014.

Chinese Office Action issued in corresponding Chinese Patent Application No. 201880052659.8, dated Jul. 6, 2021.

* cited by examiner

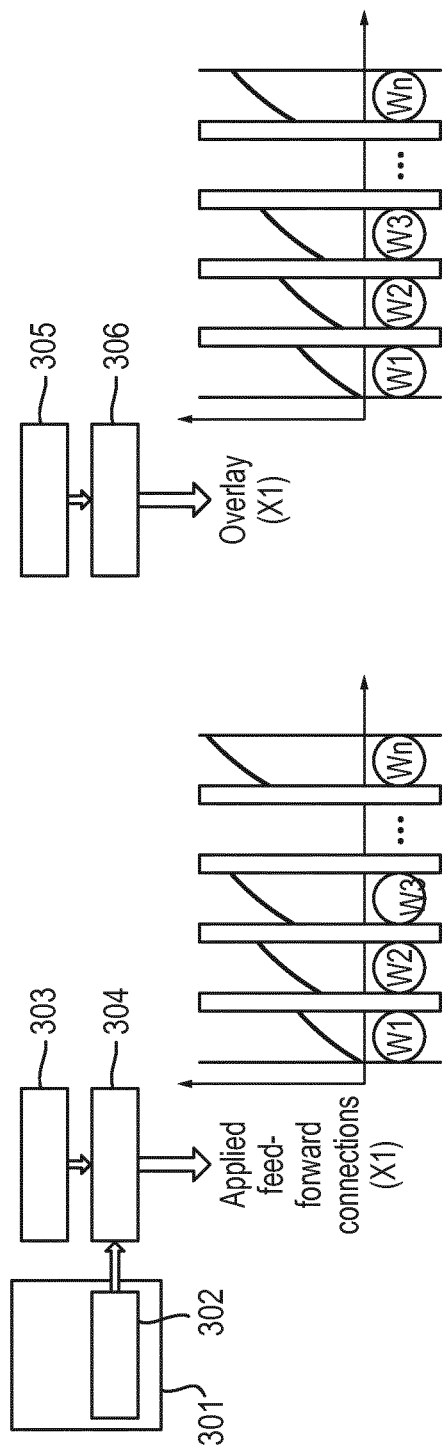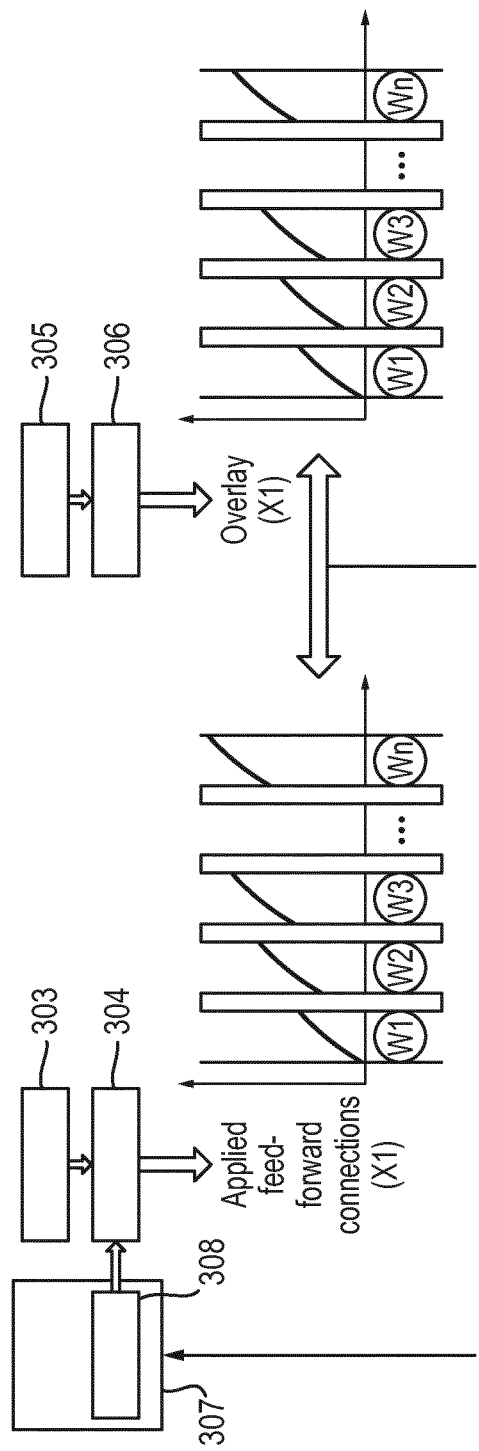
Fig. 3A
Fig. 3B

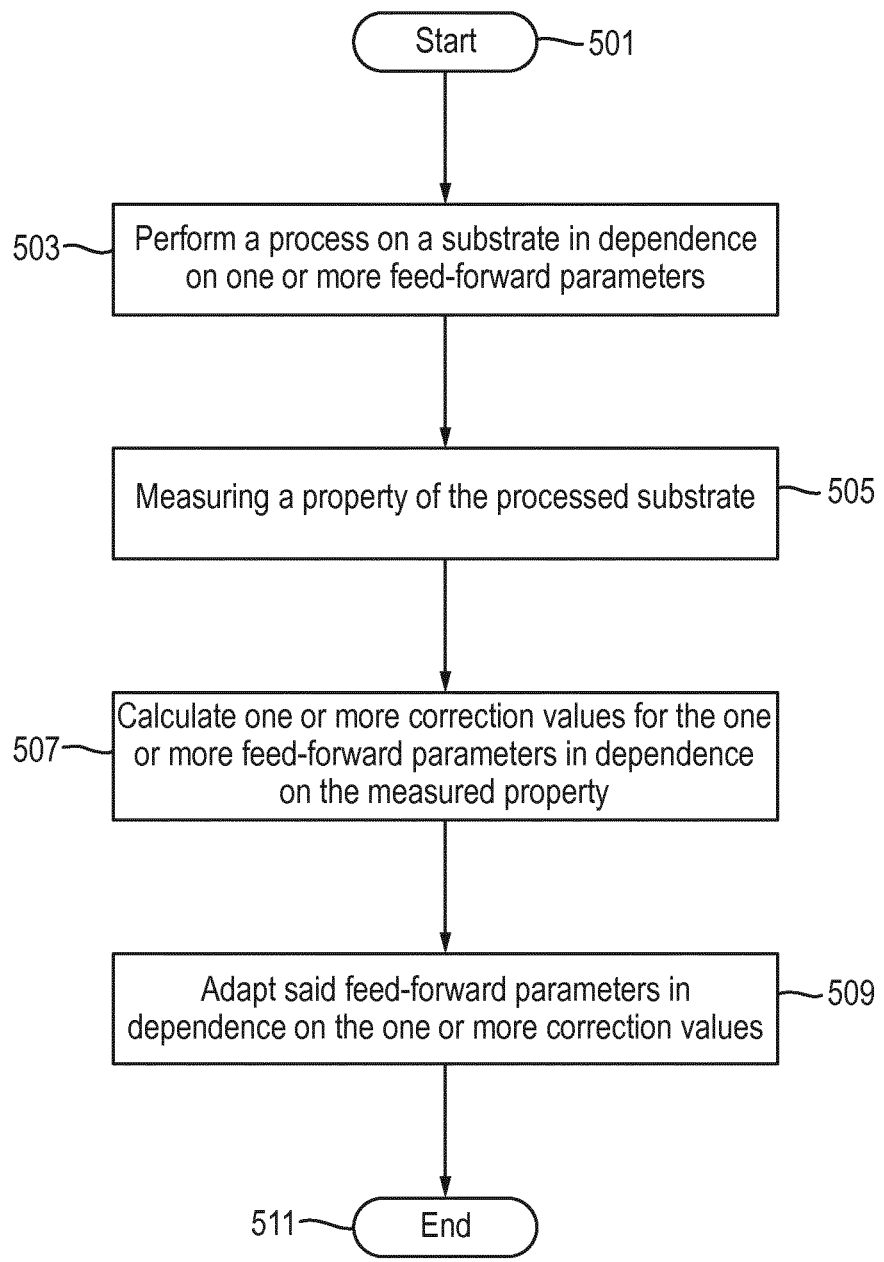

METHOD OF ADAPTING FEED-FORWARD PARAMETERS

CROSS-REFERENCE TO RELATED APPLICATIONS

This application is the U.S. national phase entry of PCT patent application no. PCT/EP20181068961, which was filed Jul. 12, 2018, which claims the benefit of priority of European patent application no. 17186129.7, which was filed on Aug. 14, 2017 and which is incorporated herein in its entirety by reference.

BACKGROUND

Field of the Invention

The present invention relates to device manufacturing using lithographic apparatus and in particular to improving the accuracy of feed-forward parameters used in device manufacturing methods

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of a die, one die, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In lithographic processes, even the smallest variations in the conditions in the lithographic apparatus prevailing when an exposure of a substrate is carried out can have an undesirable effect on the resulting device pattern. It is known that some conditions in the lithographic apparatus can change over time, both during the course of exposures of a single substrate and from substrate to substrate in spite of the lithographic apparatus being equipped with systems configured that attempt to keep the conditions constant. Therefore, it is known to use both feed-forward and feedback control systems to compensate for changes in the conditions in a lithographic apparatus. However, in view of the continual desire in the semiconductor industry to reduce the size of features (shrink) that can be formed in a device, improvements in measuring and compensating for time-varying conditions in a lithographic apparatus are desirable.

SUMMARY OF THE INVENTION

According to a first aspect of the invention, there is provided a method for correcting values of one or more feed-forward parameters used in a process of patterning substrates, the method comprising: obtaining measured overlay and/or alignment error data of a patterned substrate; calculating one or more correction values for the one or more feed-forward parameters in dependence on the measured overlay and/or alignment error data.

Preferably, the overlay and/or alignment error data is measured by a Hybrid sampling scheme.

Preferably, the one or more feed-forward parameters are adapted during the processing of a substrate lot.

Preferably, the feed-forward parameters are calibration values for a Zernike drift.

Preferably, the one or more feed-forward parameters are calibration parameters that are measurable by a calibration process.

According to a second aspect of the invention, there is provided a device manufacturing method comprising: performing a plurality of exposures on one or more substrates using a lithographic apparatus; and adapting the feed-forward parameters used to control one or more parts of the lithographic apparatus according to the method of the first aspect.

According to a third aspect of the invention, there is provided a computer program that, when executed by a computing system, causes the computing system to perform the method of the first aspect.

According to a fourth aspect of the invention, there is provided a computer readable medium carrying instructions that, when executed by a computing system, causes the computing system to perform the method of the first aspect.

According to a fifth aspect of the invention, there is provided a lithographic apparatus configured to implement the method of the first aspect.

BRIEF DESCRIPTION OF THE DRAWINGS/FIGURES

Embodiments of the invention will now be described, by way of example, with reference to the accompanying drawings in which:

FIG. 3 shows an embodiment in which feedback is used to adapt feed-forward parameters;

FIG. 5 is a flowchart of a process according to an embodiment.

DETAILED DESCRIPTION

Before describing embodiments of the invention in detail, it is instructive to present an example environment in which embodiments of the present invention may be implemented.

Figure 1:
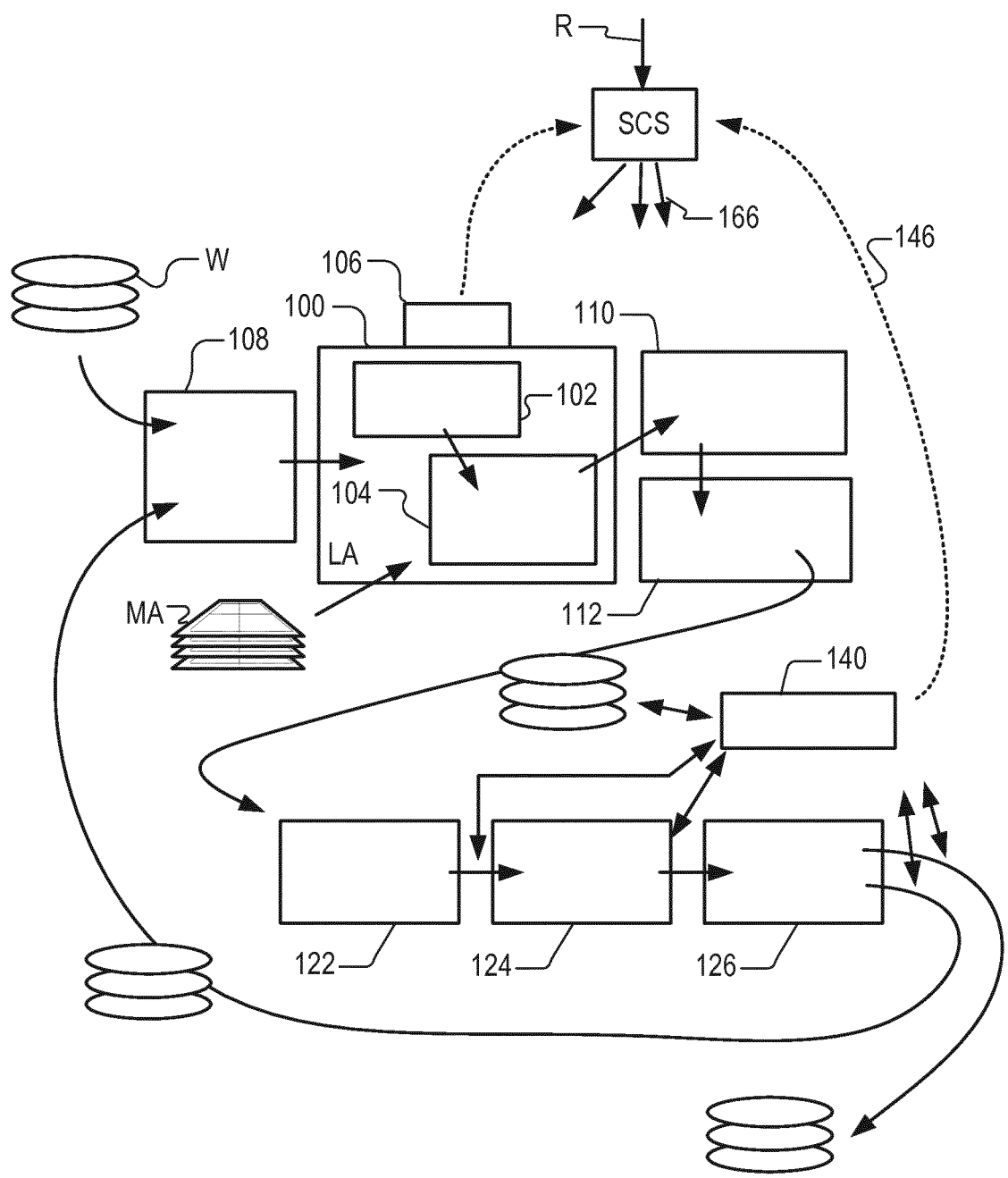
FIG. 1 depicts a lithographic apparatus together with other apparatus forming a production facility for semiconductor devices.

FIG. 1 illustrates a typical layout of a semiconductor production facility. A lithographic apparatus 100 applies a desired pattern onto a substrate. A lithographic apparatus is used, for example, in the manufacture of integrated circuits (ICs). In that instance, a patterning device MA, which is alternatively referred to as a mask or a reticle, comprises a circuit pattern of features (often referred to as "product features") to be formed on an individual layer of the IC. This pattern is transferred onto a target portion (e.g., comprising part of, one, or several dies) on a substrate 'W' (e.g., a silicon wafer) via exposure 104 of the patterning device onto a layer of radiation-sensitive material (resist) provided on the substrate. In general, a single substrate will contain a network of adjacent target portions that are successively patterned.

Known lithographic apparatus irradiate each target portion by illuminating the patterning device while synchronously positioning the target portion of the substrate at an image position of the patterning device. An irradiated target portion of the substrate is referred to as an "exposure field", or simply "field". The layout of the fields on the substrate is typically a network of adjacent rectangles aligned in accordance to a Cartesian two-dimensional coordinate system (e.g. aligned along an X and an Y-axis, both axes being orthogonal to each other).

A requirement on the lithographic apparatus is an accurate reproduction of the desired pattern onto the substrate. The positions and dimensions of the applied product features need to be within certain tolerances. Position errors may occur due to an overlay error (often referred to as "overlay"). The overlay is the error in placing a first product feature within a first layer relative to a second product feature within a second layer. The lithographic apparatus minimizes the overlay errors by aligning each wafer accurately to a reference prior to patterning. This is done by measuring positions of alignment marks which are applied to the substrate. Based on the alignment measurements the substrate position is controlled during the patterning process in order to prevent occurrence of overlay errors.

An error in a critical dimension (CD) of the product feature may occur when the applied dose associated with the exposure 104 is not within specification. For this reason the lithographic apparatus 100 must be able to accurately control the dose of the radiation applied to the substrate. CD errors may also occur when the substrate is not positioned correctly with respect to a focal plane associated with the pattern image. Focal position errors are commonly associated with non-planarity of a substrate surface. The lithographic apparatus minimizes these focal positon errors by measuring the substrate surface topography using a level sensor prior to patterning. Substrate height corrections are applied during subsequent patterning to assure correct imaging (focusing) of the patterning device onto the substrate.

To verify the overlay and CD errors associated with the lithographic process the patterned substrates are inspected by a metrology apparatus 140. A common example of a metrology apparatus is a scatterometer. The scatterometer conventionally measures characteristics of dedicated metrology targets. These metrology targets are representative of the product features, except that their dimensions are typically larger in order to allow accurate measurement. The scatterometer measures the overlay by detecting an asymmetry of a diffraction pattern associated with an overlay metrology target. Critical dimensions are measured by analysis of a diffraction pattern associated with a CD metrology target. Another example of a metrology tool is an electron beam (e-beam) based inspection tool such as a scanning electron microscope (SEM).

Within a semiconductor production facility, lithographic apparatus 100 and metrology apparatus 140 form part of a "litho cell" or "litho cluster". The litho cluster comprises also a coating apparatus 108 for applying photosensitive resist to substrates W, a baking apparatus 110, a developing apparatus 112 for developing the exposed pattern into a physical resist pattern, an etching station 122, apparatus 124 performing a post-etch annealing step and possibly further processing apparatuses, 126, etc . . . . The metrology apparatus is configured to inspect substrates after development (112) or after further processing (e.g. etching). The various apparatus within the litho cell are controlled by a supervisory control system SCS, which issues control signals 166 (which are shown by arrows coming out of the SCS in FIG. 1) to control the lithographic apparatus via lithographic apparatus control unit LACU 106 to perform recipe R. The SCS allows the different apparatuses to be operated giving maximum throughput and product yield. An important control mechanism is the feedback 146 of the metrology apparatus 140 to the various apparatus (via the SCS), in particular to the lithographic apparatus 100. Based on the characteristics of the metrology feedback corrective actions are determined to improve processing quality of subsequent substrates.

The performance of a lithographic apparatus is conventionally controlled and corrected by methods such as advanced process control (APC) described for example in US2012008127A1. The advanced process control techniques use measurements of metrology targets applied to the substrate. A Manufacturing Execution System (MES) schedules the APC measurements and communicates the measurement results to a data processing unit. The data processing unit translates the characteristics of the measurement data to a recipe comprising instructions for the lithographic apparatus. This method is very effective in suppressing drift phenomena associated with the lithographic apparatus.

The processing of metrology data to corrective actions performed by the processing apparatus is important for semiconductor manufacturing. In addition to the metrology data also characteristics of individual patterning devices, substrates, processing apparatus and other context data may be needed to further optimize the manufacturing process. The framework wherein available metrology and context data is used to optimize the lithographic process as a whole is commonly referred to as part of holistic lithography. For example context data relating to CD errors on a reticle may be used to control various apparatus (lithographic apparatus, etching station) such that said CD errors will not affect the yield of the manufacturing process. Subsequent metrology data may then be used to verify the effectiveness of the control strategy and further corrective actions may be determined.

Lithographic processes are highly sensitive to conditions prevailing in a lithographic apparatus at the time of exposure. Therefore lithographic apparatus have control systems, often including both feed forward and feedback control loops, to maintain uniform conditions and/or to provide compensating effects. Nevertheless, some process parameters, e.g. overlay and focus, may still exhibit variations as a function of substrate (wafer) and target portion (field) expose sequence. It is likely that some of these variations result from thermal effects in the scanner, for example so-called "lens heating" which derives from absorption of energy from the projection beam in elements of the projection system. With the continual desire to form smaller features in the lithographic industry (shrink) the residual effects after existing control and compensation systems become more and more serious.

Existing feed-forward solutions based on a calibration/setup and a feed-forward model that uses a limited number of parameters, e.g. the applied dose, have a finite accuracy. Residual offsets remain. Although these offsets are small, they are systematic and add linearly to the performance numbers. The residual effects show up as a drift through lot (or batch) of a process parameter. A typical example of such a drifting parameter is depicted in FIG. 2.

Figure 2:
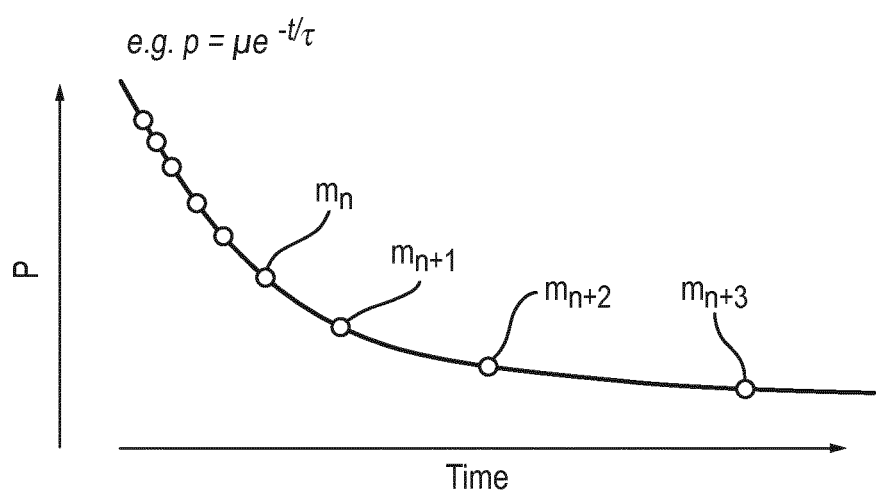
FIG. 2 depicts a time-varying process parameter and measurements of it.

As can be seen from FIG. 2, the (thermal) effect on the process parameter p is expected to vary as a function of time. A model that describes the variation of the process parameter p as a function of time 't' can be defined. In many cases, the process parameter p exhibits an exponential decay of the form:

$$p = \mu e^{-t/\tau} \qquad (1)$$

The coefficients μ and τ can be determined empirically or theoretically. Other known parameters that can be included in the model include applied exposure dose, reticle transmission and any other factors affecting the power flow in the apparatus. It should be noted that the time variation of the process parameter may be described by other functions than an exponential decay. The time variation of the process parameter may be an increase with time rather than a decrease. The time variation of the process parameter need not be monotonic and can be cyclic.

The APC process applies correction in a feedback loop. The APC corrections are set of k-parameters defined per field of each substrate, i.e. wafer, within a lot. The k-parameters parameterize the distortion of the imaging across the field of each substrate. For example each k-parameter could describe a certain image distortion component like one or more of: scaling error, barrel distortion, pincushion distortion, etc. The k-parameters can are also used as input to the lithographic system (scanner) to correct the distortion. Accordingly:

Wafer_1(field_1: k1-kn, field_2: k1-kn, etc), Wafer_2 (field_: k1-kn, field_2: k1-kn, etc), etc.

Each k-parameter is returned to the scanner by the feedback loop and used to correct the parameters of an associated part of the scanner (e.g. lens, wafer stage, reticle stage). In known systems, the same set of APC corrections is applied for all of the substrates within a lot. That is to say, the applied corrections between all of the substrates within a lot are the same:

[wafer_1(field_1)=wafer_2(field_1)], [wafer_1(field_2)=wafer_2(field_2)], etc.

The APC process can therefore only correct the average overlay error of the wafers within a lot and intra-lot overlay errors are not covered. However, parameter drift within a lot occurs and causes overlay error. Each part of the scanner is drifting due to heating during the illumination process, as well as cooling when illumination is not occurring. Separate feedforward corrections are used for each part of the scanner (e.g. lens, reticle, wafers) to counteract the heating/cooling effect of that specific part of the system. There is a need to improve the known feed-forward techniques to improve the compensation of changes in parameters. In particular, according to known techniques, the scanner feed-forward corrections, such as reticle heating corrections (RHC), lens heating feed-forward (LHFF), and wafer heating feed-forward (WHFF), are either based on time-consuming calibrations, which directly measure the effect, or based on computational methods, which are not as accurate as the calibration.

For the lens and reticle, feed-forward corrections are based on the feed-forward parameters μ and τ. Reticle heating causes changes in reticle properties. This affects the light path and causes overlay error. The mechanical deformation is calculated, in dependence on the reticle temperature, and de-composed into k-parameters. Each thermo-mechanical mode (i.e. eigen-vectors) can be modeled in time using μ's (modal participation factors) and τ's (time constants). Hence the evolution of the mechanical deformation of the reticle can be modeled. Lens heating causes the lens properties to change and aberration of the front aerial image of the lens. The aberration is decomposable into Zernikes. For each Zernike, the heating/cooling behavior is measured and fitted as below. Accordingly, the μ and τ parameters are the calibration constants for each Zernike drift:

$$\text{Zernikes: } Z_i = \Sigma_{i=1}^n \mu_i e^{at/\tau_i}$$

For wafer heating, i.e. substrate heating, a set of corrections are simulated using FEM (Finite Element Method) calculations based on the exposure dose, field locations in the substrate, etc. The FEM modeling enables prediction of a substrate deformation during exposure of the substrate in time. This predicted deformation profile is substrate field specific, but is the same for all the substrates. Based on this predicted deformation a field-specific feedforward correction is applied during the exposures of each field and each substrate according to known techniques. The feed-forward parameters are k-parameters defined per field for all the substrates that have the same settings.

For all known calibration processes, the feed-forward parameters, such as μ and τ for reticle and lens heating and k-parameters for substrate heating, are static parameters that are not changed during a production process. The feed-forward parameters can be considered to be static since the time consuming calibration processes may only be performed about once every two months and the calibration parameters are therefore changed very infrequently.

During the processes according to known techniques, the applied feed-forward corrections are calculated based on the static feed-forward parameters. However, since the feed-forward parameters are static, they are out of date with respect to the actual calibration state of the components of the system and resulting in the feed-forward corrections being inaccurate. The use of inaccurate, i.e. incorrect, feed-forward correction parameters increases the overlay error.

Embodiments of the invention improve on known techniques by adapting the feed-forward parameters so that they are updated a lot more frequently and are no longer static during a production process.

Embodiments update the feed-forward parameters by calculating corrections to the feed-forward parameters and applying these in a feedback process. This aids the overlay error correction by the APC process. The APC process is aided since, by updating the feed-forward parameters to provide a more accurate correction given the actual calibration states, the absolute amount of overlay error is reduced and smaller corrections are required by the APC process. In addition, embodiments allow intra-lot corrections to be applied to substrates.

The overlay error is measured during the production process. Embodiments use the measured overlay error to calculate corrections to the feed-forward parameters. The corrections are applied to the feed-forward parameters by a feedback loop. The feed-forward parameters are therefore controlled in dependence on the overlay error.

Alignment measurements are performed during the production process. Embodiments use the measured alignment error to calculate corrections to the feed-forward parameters. The corrections are applied to the feed-forward parameters by a feedback loop. The feed-forward parameters are therefore controlled in dependence on the alignment error.

FIG. 3B demonstrates improved compensation of reticle heating that an embodiment is expected to achieve. However, embodiments include improving the compensation by feed-forward parameter corrections of any other parts of system that are calibrated in known systems with static calibration parameters, such as the compensation of lens heating.

FIG. 3A shows operations in a known system. In FIG. 3A, 301 is a store of static parameters, 302 is a Reticle Heating Database, 303 is a Reticle Temperature Sensor scan, 304 is a Thermo-mechanical Prediction Model, 305 is Measured overlay error data as provided by a scatterometry tool or Measured alignment error data as typically measured by a lithographic apparatus or a standalone tool (by measuring the positions of alignment marks before a substrate is exposed to a patterning process), and 306 is Modeled overlay parameters in APC. As shown in FIG. 3A, the Reticle Heating Database contains the calibrated static parameters which are determined during a calibration process, that may not have been performed for two months, and are not updated during a production process.

FIG. 3B shows a how the operations are improved in an embodiment. Measured overlay or alignment error data is obtained and subsequently used to calculate corrections to the feed-forward parameters. The corrections may be applied in a feedback loop. There is a feedback path to database 307 that comprises adaptable parameters. 308 is a Reticle Heating Database, the parameters in which are changed in dependence on the feedback.

Figure 4:
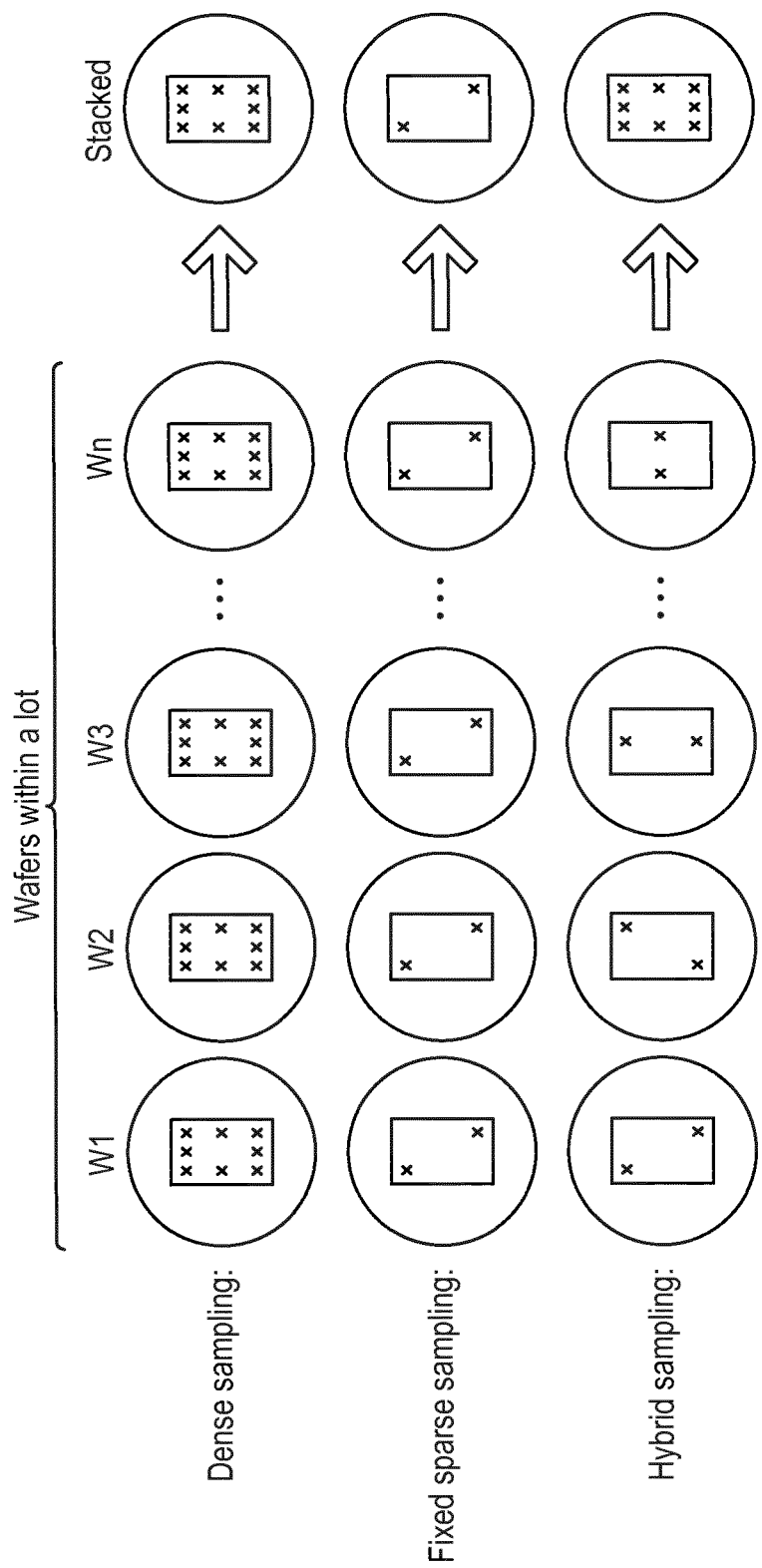
FIG. 4 shows different measurement sampling techniques.

The measured overlay or alignment error is obtained by measurement sampling. A number of different sampling techniques are possible for determining the overlay or alignment error. FIG. 4 shows Dense sampling, Fixed sparse sampling and Hybrid sampling. An advantage of dense sampling is that the overlay or alignment error can be frequently calculated. However, the measurement process is slow. Fixed sparse sampling requires less measurement time that dense sampling but does not provide measurements from the same range of locations on the substrate as dense sampling. Hybrid sampling has the same measurement time as fixed sparse sampling and, by stacking measurements, allows measurement data from the same range of locations as dense sampling to be obtained. Hybrid sampling may also be referred to as distributed sampling.

In HVM, dense sampling is usually not used due to the long measurement time that is required and fixed sparse sampling is often used. However, hybrid sampling layouts are increasingly being used in which sparse layouts vary from substrate to substrate. By stacking the measurements, a dense sampling layout is obtained in which each point is measured over one or more lots. With either dense sampling or hybrid sampling, it is possible to calculate correction values to the feed-forward parameters.

The overlay or alignment error is therefore obtained by measurement sampling during a production process. The overlay or alignment error is then used to calculate correction values for the feed-forward parameters.

The overlay or alignment data, that describes the overlay or alignment error, is representative of a distortion fingerprint. An example of how the overlay or alignment data can be used to determine adjustments to the feedforward parameters is for the overlay or alignment data to be de-corrected for the currently applied feedforward correction. Residual values can be determined that represent an error due to inaccuracies in the applied feed forward correction. The residual values can be used to determine adjustments to k-parameters. The feedforward parameters can then be adjusted so the applied feedforward correction reduces the residual values.

For reticle heating, the measured overlay or alignment is used to model the related k-parameter drifts. The modelled values are used to calculate adjustments to the μ and τ parameters.

For lens heating, the measured overlay or alignment error is used to calculate the Zernikes using the equation:

$$\text{Overlay/Alignment Error} = \text{Sensitivities} \times \text{Zernikes}$$

The Sensitivities are constant for each overlay/alignment measurement structure and can be measured and/or calculated. From the calculated Zernikes, the correction values to the μ and τ parameters can be calculated.

For substrate heating, the overlay/alignment error can be compared with FEM based thermo-mechanical model simulation and corrections to the feed-forward parameters (k-parameters) may be calculated based on the comparison. The correction to the feed-forward parameters in this case involves scaling of the predicted distortion fingerprint by a factor 'λ' (scaling parameter). So in this case not a time-evolution parameter is adapted, but a predicted heating-induced distortion of the substrate is adapted in order to yield a better feed-forward correction of substrate heating effects.

In addition to the above, embodiments include controlling any of a number of different essentially static value feed-forward machine constants in known systems. Embodiments use feedback to change the machine constants to improve their accuracy.

Advantages of embodiments include:
Overlay error due to, for example, lens and reticle heating is reduced and there is no need for re-calibration of the system to obtain static calibration parameters;
The frequency and accuracy of the corrections applied by APC process is increased; and
Computational feed-forward corrections are more usable as they are automatically fine-tuned within a few lots of substrates, or subsets of lots of substrates.

Embodiments are particularly advantageous in high volume manufacturing, HVM, of semiconductor devices.

Examples of process parameters to which embodiments of the present invention can be applied in order to reduce error include: Edge Placement Error (EPE), overlay, CD, CDU, sidewall angle, line edge roughness and focus. Markers and measurement techniques suitable for measuring these parameters are well known in the art.

FIG. 5 is a flowchart showing processes according to embodiments. In step 501, the process begins. In step 503, a process is performed on a substrate in dependence on one or more feed-forward parameters. In step 505, a property of the processed substrate is measured. In step 507, one or more correction values for the one or more feed-forward parameters are calculated in dependence on the measured property. In step 509, the feed-forward parameters are adapted in dependence on the one or more correction values. In step 511, the process ends.

While specific embodiments of the invention have been described above, it will be appreciated that the invention may be practiced otherwise than as described.

In the above-described embodiments, correction values are calculated from measured data and fed-back to change the values of feed-forward parameters. The correction values may be any of the new values of feed-forward parameters to be used, the required change of the feed-forward parameters as an absolute or relative amount or data from which any of these can be calculated.

An embodiment may include a computer program containing one or more sequences of machine-readable instructions configured to instruct various apparatus as depicted in FIG. 1 to perform measurement and optimization steps and to control a subsequent exposure process as described above. This computer program may be executed, for example, within the control unit LACU or the supervisory control system SCS of FIG. 1 or a combination of both. There may also be provided a data storage medium (e.g., semiconductor memory, magnetic or optical disk) having such a computer program stored therein.

Although specific reference may have been made above to the use of embodiments of the invention in the context of optical lithography, it will be appreciated that the invention may be used in other applications, for example imprint lithography, and where the context allows, is not limited to optical lithography. In imprint lithography topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments of the invention are disclosed in the list of numbered embodiments below:

1. A method of adapting one or more feed-forward parameters used in a patterning process, the method comprising:
    performing a patterning process on a substrate using on one or more feed-forward parameters configured to reduce distortion effects caused by one or more of reticle heating, lens heating and substrate heating;
    measuring overlay and/or alignment error data of the processed substrate;
    calculating one or more correction values for the one or more feed-forward parameters in dependence on the measured overlay and/or alignment error data; and
    adapting said feed-forward parameters in dependence on the one or more correction values.
2. The method according to embodiment 1, wherein the overlay and/or alignment error data is measured using a Hybrid sampling scheme.
3. The method according to embodiment 1 or 2, wherein the one or more feed-forward parameters are adapted during the processing of a substrate lot.
4. The method according to any preceding embodiment, wherein the feed-forward parameters are time constants configured to define a Zernike drift model.
5. The method according to any of embodiments 1 to 3, wherein the feed-forward parameters are time constants configured to define a reticle heating model.
6. The method according to any of embodiments 1 to 3, wherein the feed-forward parameters are field-specific heating-induced distortions of the substrate due to substrate heating.
7. The method according to embodiment 4 or 5, wherein a correction value of the one or more correction values is an updated time constant.
8. The method according to embodiment 6, wherein a correction value of the one or more correction values is a scaling parameter configured to scale the field-specific heating induced distortions.
9. The method according to any preceding embodiment, wherein the one or more feed-forward parameters are calibration parameters that are measurable by a calibration process.
10. A device manufacturing method comprising:
    performing a plurality of exposures on one or more substrates using a lithographic apparatus; and
    adapting the feed-forward parameters used to control one or more parts of the lithographic apparatus according to the method of any preceding embodiment.
11. A computer program that, when executed by a computing system, causes the computing system to perform the method of any preceding embodiment.
12. A computer readable medium carrying instructions that, when executed by a computing system, causes the computing system to perform the method of any of embodiments 1 to 10.
13. A lithographic apparatus configured to implement the method according to any of embodiments 1 to 10.
14. A method for correcting values of one or more feed-forward parameters used in a process of patterning substrates, the method comprising:
    obtaining measured overlay and/or alignment error data of a patterned substrate;
    calculating one or more correction values for the one or more feed-forward parameters in dependence on the measured overlay and/or alignment error data.
15. The method of embodiment 14, wherein the feed-forward parameters are configured to reduce distortion effects caused by one or more of reticle heating, lens heating and substrate heating.
16. The method according to embodiment 15, further comprising a step of adapting said feed-forward parameters in dependence on the one or more correction values.
17. The method according to embodiment 14, wherein the overlay and/or alignment error data is measured using a hybrid sampling scheme.
18. The method according to embodiment 17, wherein the one or more feed-forward parameters are adapted during the processing of a substrate lot.
19. The method according to any of embodiments 14 to 18, wherein the feed-forward parameters are time constants configured to define a Zernike drift model.
20. The method according to any of embodiments 14 to 18, wherein the feed-forward parameters are time constants configured to define a reticle heating model.
21. The method according to any of embodiments 14 to 18, wherein the feed-forward parameters are field-specific heating-induced distortions of the substrate due to substrate heating.
22. The method according to any of embodiments 14 to 20, wherein a correction value is an updated time constant.
23. The method according to embodiment 21, wherein a correction value is a scaling parameter configured to scale the field-specific heating induced distortions.
24. The method according to any of embodiments 14 to 23, wherein the one or more feed-forward parameters are calibration parameters that are measurable by a calibration process.
25. A device manufacturing method comprising:
    performing a plurality of exposures on one or more substrates using a lithographic apparatus; and
    adapting the feed-forward parameters used to control one or more parts of the lithographic apparatus according to the method of any of embodiments 14 to 24.
26. A computer program that, when executed by a computing system, causes the computing system to perform the method of any of embodiments 14 to 25.
27. A computer readable medium carrying instructions that, when executed by a computing system, causes the computing system to perform the method of any of embodiments 14 to 25.
28. A lithographic apparatus configured to implement the method according to any of embodiments 14 to 25.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 1-100 nm), as well as particle beams, such as ion beams or electron beams. Implementations of scatterometers and other inspection apparatus can be made in UV and EUV wavelengths using suitable sources, and the present disclosure is in no way limited to systems using IR and visible radiation.

The term "lens", where the context allows, may refer to any one or combination of various types of optical components, including refractive, reflective, magnetic, electromagnetic and electrostatic optical components. Reflective components are likely to be used in an apparatus operating in the UV and/or EUV ranges.

The breadth and scope of the present invention should not be limited by any of the above-described exemplary embodiments, but should be defined only in accordance with the following claims and their equivalents.

The invention claimed is:

1. A method for correcting values of one or more feed-forward parameters used in a process of patterning substrates, the method comprising:
obtaining measured overlay data and/or measured alignment error data from an alignment mark, of a patterned substrate; and
determining, by a hardware computer system, one or more correction values for the one or more feed-forward parameters in dependence on the measured overlay and/or alignment error data, wherein the one or more feed-forward parameters are one or more parameters of a feed-forward model or are one or more parameters determined from a feed-forward model.

2. The method according to claim 1, wherein the one or more feed-forward parameters are configured to reduce distortion effects caused by one or more selected from: reticle heating, lens heating and/or substrate heating.

3. The method according to claim 2, further comprising adapting the one or more feed-forward parameters in dependence on the one or more correction values.

4. The method according to claim 3, wherein the one or more feed-forward parameters are adapted during the processing of a substrate lot.

5. A device manufacturing method comprising:
performing a plurality of exposures on one or more substrates using a lithographic apparatus; and
adapting the one or more feed-forward parameters used to control one or more parts of the lithographic apparatus, according to the method of claim 3.

6. The method according to claim 2, wherein the one or more feed-forward parameters are one or more time constants configured to define a Zernike drift model.

7. The method according to claim 6, wherein a correction value of the one or more correction values is an updated time constant.

8. The method according to claim 2, wherein the one or more feed-forward parameters are one or more time constants configured to define a reticle heating model.

9. The method according to claim 2, wherein the one or more feed-forward parameters are one or more field-specific heating-induced distortions of the substrate due to substrate heating.

10. The method according to claim 9, wherein a correction value of the one or more correction values is a scaling parameter configured to scale the one or more field-specific heating induced distortions.

11. The method according to claim 1, wherein the overlay and/or alignment error data is measured using a hybrid sampling scheme.

12. The method according to claim 1, wherein the one or more feed-forward parameters are one or more calibration parameters that are measurable by a calibration process.

13. A non-transitory computer-readable medium carrying instructions, the instructions, when executed by a computing system, configured to cause the computing system to at least:
obtain measured overlay data and/or measured alignment error data from an alignment mark, of a patterned substrate; and
determine one or more correction values for one or more feed-forward parameters used in a process of patterning substrates in dependence on the measured overlay and/or alignment error data, wherein the one or more feed-forward parameters are one or more parameters of a feed-forward model or are one or more parameters determined from a feed-forward model.

14. The computer-readable medium of claim 13, wherein the one or more feed-forward parameters are configured to reduce distortion effects caused by one or more selected from: reticle heating, lens heating and/or substrate heating.

15. The computer-readable medium of claim 13, wherein the instructions are further configured to cause the computer system to adapt the one or more feed-forward parameters in dependence on the one or more correction values.

16. The computer-readable medium of claim 13, wherein the overlay and/or alignment error data is measured using a hybrid sampling scheme.

17. The computer-readable medium of claim 13, wherein the one or more feed-forward parameters are one or more time constants configured to define a Zernike drift model.

18. The computer-readable medium of claim 17, wherein a correction value of the one or more correction values is an updated time constant.

19. The computer-readable medium of claim 13, wherein the one or more feed-forward parameters are one or more time constants configured to define a reticle heating model.

20. The computer-readable medium of claim 13, wherein the one or more feed-forward parameters are one or more field-specific heating-induced distortions of the substrate due to substrate heating.

21. A lithographic apparatus, comprising:
a patterning system configured to transfer a pattern onto a substrate; and
the computer-readable medium of claim 13.

22. The computer-readable medium of claim 13, wherein the one or more feed-forward parameters are one or more calibration parameters that are measurable by a calibration process.

* * * * *